United States Patent
Fukui et al.

(10) Patent No.: US 10,608,464 B2
(45) Date of Patent: Mar. 31, 2020

(54) ELECTRONIC APPARATUS AND CHARGING CONTROL METHOD USING PLURALITY OF POWER SOURCES THEREFOR

(71) Applicant: SHARP KABUSHIKI KAISHA, Sakai, Osaka (JP)

(72) Inventors: Atsushi Fukui, Sakai (JP); Ryoichi Komiya, Sakai (JP); Mehdi El Fassy Fihry, Sakai (JP); Yuki Watanabe, Sakai (JP); Ryohsuke Yamanaka, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 254 days.

(21) Appl. No.: 15/506,455

(22) PCT Filed: Jul. 6, 2015

(86) PCT No.: PCT/JP2015/069452
§ 371 (c)(1),
(2) Date: Feb. 24, 2017

(87) PCT Pub. No.: WO2016/031395
PCT Pub. Date: Mar. 3, 2016

(65) Prior Publication Data
US 2017/0256981 A1    Sep. 7, 2017

(30) Foreign Application Priority Data
Aug. 28, 2014  (JP) .................................. 2014-174556

(51) Int. Cl.
*H02J 7/35*    (2006.01)
*H02J 7/34*    (2006.01)
(Continued)

(52) U.S. Cl.
CPC .............. *H02J 7/35* (2013.01); *H02J 7/0068* (2013.01); *H02J 7/34* (2013.01); *G01R 19/16538* (2013.01)

(58) Field of Classification Search
CPC .. H02J 7/35; H02J 7/355; H02J 7/0068; H02J 7/34; Y02E 60/12; H01M 10/465; H01M 16/006; G01R 19/16538
(Continued)

(56) References Cited

U.S. PATENT DOCUMENTS 4,963,811 A * 10/1990 Weber .................... G01B 3/205
136/293
2010/0084006 A1 * 4/2010 Shyu ...................... G04C 10/02
136/252
(Continued)

FOREIGN PATENT DOCUMENTS

JP    H07-131939 A    5/1995
JP    2002-325378 A   11/2002
(Continued)

OTHER PUBLICATIONS

International Search Report for PCT/JP2015/069452, dated Sep. 15, 2015, 2 pages.
(Continued)

*Primary Examiner* — Richard Isla
*Assistant Examiner* — Mohammed J Sharief
(74) *Attorney, Agent, or Firm* — ScienBiziP, P.C.

(57) ABSTRACT

A controller (10) of an electronic book reader selects, as a power source for operating the electronic book reader, a capacitor (6) configured to accumulate power from a solar cell (5) upon performing a page turning operation, and a storage cell (7) upon performing an operation of downloading an electronic book.

9 Claims, 10 Drawing Sheets

(51) Int. Cl.
*H02J 7/00* (2006.01)
*G01R 19/165* (2006.01)

(58) Field of Classification Search
USPC .................................. 320/101; 307/43–87
See application file for complete search history.

(56) References Cited

U.S. PATENT DOCUMENTS

| | | | | | |
|---|---|---|---|---|---|
| 2010/0295376 | A1* | 11/2010 | Black | ................ | H02J 7/0068 307/80 |
| 2011/0109259 | A1* | 5/2011 | Choi | ................ | H04M 1/0262 320/101 |
| 2011/0111811 | A1* | 5/2011 | Juang | ................ | G06F 1/26 455/573 |
| 2011/0143699 | A1* | 6/2011 | Noh | ................ | H04W 52/0261 455/127.1 |
| 2011/0231026 | A1* | 9/2011 | Yaoyama | ............ | G03G 15/5004 700/291 |
| 2014/0084854 | A1* | 3/2014 | Eifuku | ................ | H02J 7/0055 320/107 |

FOREIGN PATENT DOCUMENTS

| | | |
|---|---|---|
| JP | 2006-201461 | 8/2006 |
| JP | 2010-104117 | 5/2010 |
| JP | 2013-055867 A | 3/2013 |
| JP | 2013-089527 | 5/2013 |
| JP | 2013-117625 | 6/2013 |
| JP | 2014-032808 A | 2/2014 |
| JP | 2014-075902 A | 4/2014 |

OTHER PUBLICATIONS

Atsushi Fukui et al, "Improvement in efficiency of dye-sensitized solar cell module", Sharp Giho, [online], No. 98, Sharp Kabushiki Kaisha, pp. 34-35.

* cited by examiner

| PROCESS | POWER SOURCE USED |
|---|---|
| PAGE TURNING | CAPACITOR |
| DOWNLOAD | STORAGE CELL |
| OUTPUT AUDIO | STORAGE CELL |
| DISPLAY EXPANSION/SHRINKAGE | CAPACITOR |

ELECTRONIC APPARATUS AND CHARGING CONTROL METHOD USING PLURALITY OF POWER SOURCES THEREFOR

This application is the U.S. national phase of International Application No. PCT/JP2015/069452 filed 6 Jul. 2015, which designated the U.S. and claims priority to JP Patent Application No. 2014-174556 filed 28 Aug. 2014, the entire contents of each of which are hereby incorporated by reference.

TECHNICAL FIELD

The present invention relates to an electronic apparatus including, as a power source, a solar cell and a storage cell, and relates also to a control method therefor. In particular, the present invention relates to an electronic book reader that is an apparatus for browsing an electronic book.

BACKGROUND ART

In view of portability, the electronic book reader employs a storage cell as a power source. Generally, the storage cell needs to be charged from an electric outlet (AC power source) every one to two weeks. This is burdensome for a user. Therefore, a solar cell is used to attempt to extend the charging interval.

For example, there is a commercially available product configured so that an amorphous silicon (a-Si) solar cell and another storage cell are attached to a cover of the electronic book reader, the other storage cell is charged with the a-Si solar cell, and upon completion of the charging, the storage cell of the electronic book reader is charged via a USB cable from the other storage cell. However, the product has a problem in that a user is required carry the other storage cell in addition to the storage cell in the electronic book reader, resulting in an increased weight and cost.

Further, in a display system described in PTL 1, power from a solar cell is charged to a secondary cell, circuitry is operated with the power from the secondary cell, and prescribed information is displayed in an electronic paper in accordance with an operation status of the circuitry. Moreover, in another display system described in the PTL 1, a solar cell and a cell (a primary cell or a secondary cell) are each connected to the circuitry via a capacitor circuit, and the circuitry is electrically connected to the electronic paper. When the power from the solar cell and the power from the cell are used to drive the circuitry, a prescribed display is performed in a display unit of the electronic paper.

Further, in a power source apparatus described in PTL 2, power from a solar cell is charged to a lead storage cell and a capacitor module. The power source apparatus acquires solar irradiance from a sensor and determines whether or not the solar irradiance is stable on the basis of a difference in solar irradiance. Upon the solar irradiance being stable, the power source apparatus charges the power to a lead storage cell which takes time to charge. On the other hand, upon the solar irradiance being unstable, the power source apparatus switches the charging target to the capacitor module and charges the capacitor module. The capacitor module is constituted by one or more capacitors having a relatively small electrostatic capacity. The power source apparatus acquires a charged current extractable from the solar cell, calculates a charging time per capacitor, sequentially switches a plurality of capacitors in accordance with the charging time, and charges the capacitors.

In an electronic paper described in PTL 3, whether or not the power supplied by a solar cell is equal to or greater than a voltage value capable of controlling the electronic paper is detected. Upon the power being less than the voltage value, the electronic paper is controlled with the power from the storage cell. On the other hand, upon the power being equal to or greater than the voltage value, the electronic paper is controlled with the power supplied by the solar cell, and after completion of an image update process, redundant power is charged to the storage cell.

CITATION LIST

Patent Literature

PTL 1: Japanese Unexamined Patent Application Publication No. 2013-117625A (published on Jun. 13, 2013)
PTL 2: Japanese Unexamined Patent Application Publication No. 2010-104117A (published on May 6, 2010)
PTL 3: Japanese Unexamined Patent Application Publication No. 2006-201461A (published on Aug. 3, 2006)
PTL 4: Japanese Unexamined Patent Application Publication No. 2013-089527A (published on May 13, 2013)

SUMMARY OF INVENTION

Technical Problem

Generally, in the storage cell, a charging performance and a discharging performance deteriorate as charging and discharging are repeated, which shortens a service life of the storage cell. Further, when the storage cell is a lithium ion battery, its service life is said to be extended by repeating a light charging and discharging rather than repeating complete charging and complete discharging. However, a charging-and-discharging control circuit configured to control charging and discharging of the lithium ion cell may not completely follow the charging and discharging. In this case, a load is imposed on the lithium ion cell, which shortens its service life. Therefore, it is desired that in the storage cell, the charging frequency and the discharging frequency are reduced.

For this, in the other display system described in PTL 1, the power supplied from the solar cell and the power supplied from the storage cell are used to drive the circuitry, and thus, it is expected that the discharging frequency of the storage cell is reduced. However, the power supplied from the solar cell is varied depending on the solar irradiance. Thus, in the storage cell, the power to be discharged is varied, and hence, a large load is imposed on the storage cell. As a result, the service life of the storage cell is shortened.

Further, in the electronic paper described in PTL 3, upon the power supplied by a solar cell being equal to or greater than a voltage value capable of controlling the electronic paper, the electronic paper is controlled with the supplied power, and thus, it is expected that the discharging frequency of the storage cell is reduced. However, in this case, it is necessary to constantly detect the supplied power from the solar cell, and thus, a processing load is large.

The present invention has been achieved in view of the above problems, and an object thereof is to provide an electronic apparatus or the like capable of reducing, with a simple process, a frequency of discharging from a storage cell.

Solution to Problem

An electronic apparatus according to one aspect of the present invention is an electronic apparatus including a solar cell and a storage cell. To resolve the above problem, the apparatus includes a capacitor configured to accumulate power generated by the solar cell, and a power source selector configured to select a power source configured to allow the electronic apparatus to operate. The power source selector selects, as the power source, the capacitor upon the electronic apparatus performing a first operation executable with a power amount equal to or less than a prescribed value. On the other hand, the power source selector selects, as the power source, the storage cell upon the electronic apparatus performing a second operation requiring a power amount greater than the prescribed value.

Further, a control method of an electronic apparatus according to another aspect of the present invention is a control method of an electronic apparatus including a solar cell, a capacitor configured to accumulate power generated by the solar cell, and a storage cell. To resolve the above problem, the method includes the steps of determining an operation that the electronic apparatus should execute, and selecting, on the basis of the operation determined in the step of determining the operation, a power source configured to allow the electronic apparatus to operate. In the step of selecting the power source, the capacitor is selected as the power source, upon the electronic apparatus performing a first operation executable with a power amount equal to or less than a prescribed value. On the other hand, the storage cell is selected as the power source, upon the electronic apparatus performing a second operation requiring a power amount greater than the prescribed value.

Advantageous Effects of Invention

According to one aspect of the present invention, it is possible to provide an effect of reducing a discharge frequency from a storage cell with a simple process.

DESCRIPTION OF EMBODIMENTS

Figure 1:
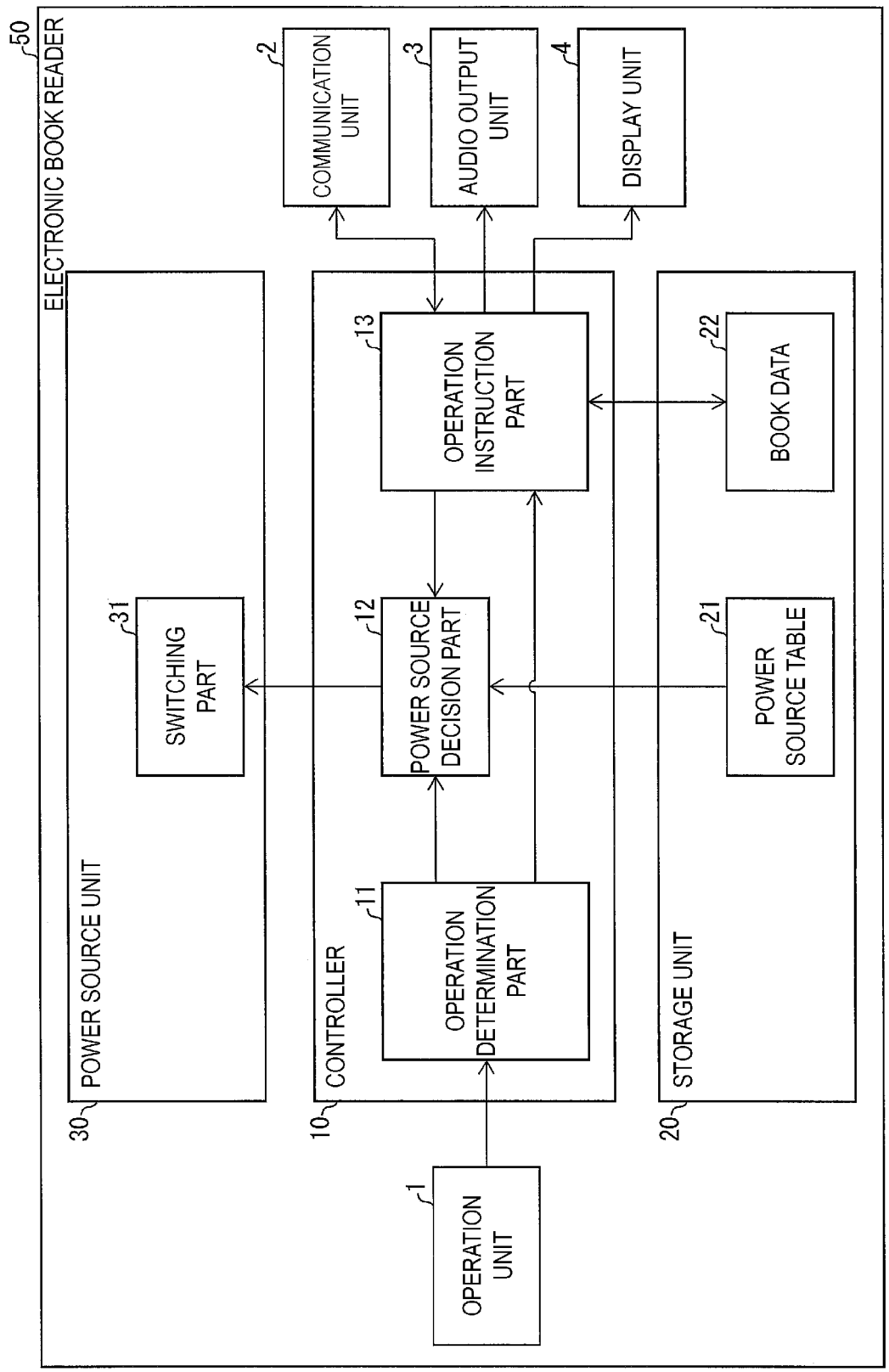
FIG. 1 is a functional block diagram illustrating a schematic constitution of an electronic book reader according to one embodiment of the present invention.

An embodiment of the present invention will be described in detail below. It is noted that for simplicity, components illustrated in respective embodiments are designated by the same reference numerals as those having the same function, and description thereof are omitted as appropriate.

First Embodiment

One embodiment of the present invention will be described using FIGS. 1 to 4.

Schematic Constitution of Electronic Book Reader

FIG. 1 is a functional block diagram illustrating a schematic constitution of an electronic book reader (electronic apparatus) 50 according to the present embodiment. The electronic book reader 50 is a dedicated terminal for browsing an electronic book, and as illustrated in FIG. 1, includes an operation unit 1, a communication unit 2, an audio output unit 3, a display unit 4, a controller 10, a storage unit 20, and a power source unit 30.

In the operation unit 1, operation data is created by a user operating an input device such as a button switch provided in a surface of the electronic book reader 50. The operation unit 1 transmits the data created by the user operating an input device to the controller 10. Examples of the input device include a touch panel and the like, in addition to the button switch.

The display unit 4 is a unit for receiving display data from the controller 10, and displaying the data on a display screen on the basis of the received display data. Specifically, the display unit 4 is constituted to include a display element and a driver circuit. Examples of the display element include Liquid Crystal Display (LCD), an Electroluminescence (EL) display, and an electronic paper. The driver circuit drives the display element on the basis of the received display data. Note that of the above display elements, in view of power consumption, viewability, and thickness, the electronic paper is preferable as a display element for displaying the electronic book.

The communication unit 2 is a unit for transmitting and receiving data with an external device. Specifically, the communication unit 2 performs a modulation and modulation process on data, for example. Note that the communication may be performed wirelessly and with wire. In the present embodiment, the communication unit 2 requests, to an external server, the data of the electronic book via the Internet, and receives the data via the Internet from the server.

The audio output unit 3 is a unit for converting audio data from the controller 10 into a sound wave or a sound wave signal and outputting the converted sound wave or sound wave signal to outside. Specifically, the audio output unit 3 is constituted to include a speaker, an audio output connector, and the like. A headphone connected to the audio output connector can output the audio from the headphone.

The controller 10 is a unit for integrally controlling various types of constitutions inside the electronic book reader 50, and is constituted to include a processor such as Central Processing Unit (CPU). The storage unit 20 is a unit for storing various types of data and programs, and is constituted to include a storage element such as Random Access Memory (RAM), Read Only Memory (ROM), and a flash memory. The power source unit 30 is a unit for supplying power to various types of loads in the electronic book reader 50 itself. Note that the controller 10, the storage unit 20, and the power source unit 30 will be described in detail later.

Detail of Power Source Unit

Figures 2, 3:
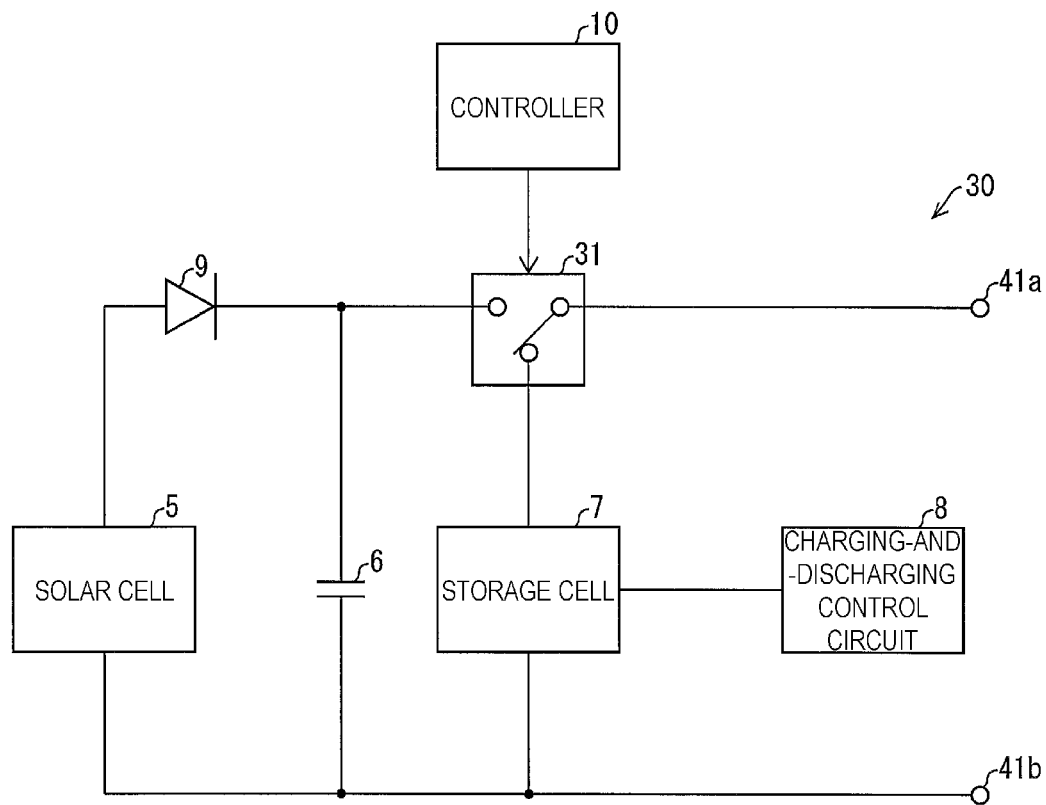
FIG. 2 is a block diagram illustrating a constitution example of a power source unit of the electronic book reader.
FIG. 3 is a figure showing, in a table format, an example of a power source table stored in a storage unit of the electronic book reader.

FIG. 2 is a block diagram illustrating a constitution example of the power source unit 30 of the electronic book reader 50 according to the present embodiment. As illustrated, the power source unit 30 is constituted to include a solar cell 5, a capacitor 6, a storage cell 7, a charging-and-discharging control circuit 8, a rectifying device (rectifying circuit) 9, a switching part 31, and terminals 41a, 41b. The terminals 41a, 41b are terminals for connecting with various types of loads in the electronic book reader 50.

The solar cell 5 is a solar cell for converting light energy into electric energy. Note that as the solar cell 5, a well-known cell may be appropriately used. However, a dye sensitized solar cell is preferably used as a cell capable of efficiently generating power even with indoor illumination such as a fluorescent light, scattered light by the window, and other faint lights. Note that the dye sensitized solar cell is described in PTL 4, for example, and thus, a detailed description thereof will be omitted.

The capacitor 6 is a capacitor connected to the solar cell 5 and for accumulating the electric power generated by the solar cell 5. One ends of the solar cell 5 and the capacitor 6 are connected via the switching part 31 to the terminal 41a, and the other ends thereof are connected to the terminal 41b.

The storage cell 7 is a storage cell for converting, according to an electrochemical method, the electric energy from an external power source such as an electric outlet (not illustrated) into chemical energy to accumulate the converted energy therein. One end of the storage cell 7 is connected via the switching part 31 to the terminal 41a, and the other end thereof is connected to the terminal 41b.

The charging-and-discharging control circuit 8 is a circuit for controlling, on the basis of the voltage of the storage cell 7, charging and discharging of the storage cell 7.

The rectifying device 9 is a device connected between the solar cell 5, and the capacitor 6 and the storage cell 7, and for preventing a reverse flow of a current from the capacitor 6 and the storage cell 7 to the solar cell 5. Note that the rectifying device 9 may be constituted by a circuit or may be omitted.

The switching part 31 is a part for switching, on the basis of an instruction from the controller 10, a connection target of the terminal 41a to either one of a side connected to the storage cell 7 and a side connected to the solar cell 5 and capacitor 6. Upon the connection target of the terminal 41a being switched to the side connected to solar cell 5 and capacitor 6, the electric energy accumulated in the capacitor 6 is supplied to a load connected to the terminals 41a, 41b. On the other hand, upon the connection target of the terminal 41a being switched to the storage cell 7 side, the chemical energy accumulated in the storage cell 7 is converted into electric energy. The converted electric energy is supplied to the load connected to the terminals 41a, 41b.

Therefore, the capacitor 6 and the storage cell 7 serve as a power source for supplying power necessary for an operation performed by the electronic book reader 50. As a result, the power is supplied to each load of the electronic book reader 50 from either one of the capacitor 6 and the storage cell 7.

Further, the power generated by the solar cell 5 is accumulated in the capacitor 6, and thus, the solar cell 5 can stably supply the load of the electronic book reader 50 with a significant power amount equal to or less than a prescribed value. Thus, upon the electronic book reader 50 performing a first operation executable with a power amount equal to or less than a prescribed value, the capacitor 6 is utilized as a power source. On the other hand, upon the electronic book reader 50 performing a second operation requiring a power amount greater than a prescribed value, the storage cell 7 can be used as a power source. As a result, a discharge frequency from the storage cell 7 can be reduced. Further, whether or not either one of the capacitor 6 or the storage cell 7 is selected as a power source is decided on the basis of the operation of the electronic book reader 50. This eliminates the need for constantly detecting the power from the solar cell 5. Therefore, a discharge frequency from the storage cell 7 can be reduced with a simple process.

Detail of Controller and Storage Unit

As illustrated in FIG. 1, the controller 10 is constituted to include an operation determination part 11, a power source decision part (power source selector) 12, and an operation instruction part 13. Further, the storage unit 20 stores a power source table 21 and book data 22.

The book data 22 is data of an electronic book. Note that in addition to a text, the book data 22 may include an image, an audio, and the like. Further, the book data 22 may be previously stored in the storage unit 20, may be acquired from a recording medium attachable to the electronic book reader 50, or may be acquired via the Internet from a server.

In the power source table 21, various types of operations and a power source (the capacitor 6 or the storage cell 7) that should be used upon the operations being performed are associated. FIG. 3 is a figure showing, in a table format, an example of the power source table 21. The power source table 21 is created as follows. That is, an operation performed in a short period of time (for example, several seconds) such as turning a page, and expanding and shrinking of a display, is associated, as a first operation, with the capacitor 6. On the other hand, other operations are associated, as a second operation, with the storage cell 7. Thus, the power source table 21 is created.

Alternatively, the power source table 21 may be created as follows. That is, a time average value of an amount of power accumulated from the solar cell 5 into the capacitor 6 in a normal use state is calculated or acquired. Next, an amount of power consumption required for various types of operations are calculated or acquired. Then, an operation requiring a less amount of power consumption than the time average value of the power amount is associated with the capacitor 6. On the other hand, other operations are associated with the storage cell 7. Thus, the power source table 21 is created.

The operation determination part 11 is a part for determining, on the basis of operation data from the operation unit 1, an operation that the electronic book reader 50 should execute. For example, in a state where the electronic book is displayed in the display unit 4, upon a user performing a flick operation in the operation unit 1 or depressing a button for instructing a page turning, the operation determination part 11 determines that an operation of turning a page should be performed. The operation determination part 11 transmits a determination result to the power source decision part 12 and the operation instruction part 13.

Note that the operation determination part 11 may perform the determination on the basis of data from another functional block. For example, upon the operation determination part 11 being notified from a clock (not illustrated) that a prescribed time has arrived, the operation determination part 11 may determine that an operation of downloading the electronic book should be performed.

The power source decision part 12 is a part for deciding, by referring to the power source table 21, a power source corresponding to the determination result determined by the operation determination part 11. The power source decision part 12 instructs the switching part 31 of the power source unit 30 to utilize the decided power source. Further, upon the operation instruction part 13 notifying the power source decision part 12 that the operation determined by the operation determination part 11 is ended, the power source decision part 12 instructs the switching part 31 to utilize the storage cell 7 as a power source.

The operation instruction part 13 is a part for instructing various types of devices to execute the operation determined by the operation determination part 11. Upon the operation being ended, the operation instruction part 13 notifies the power source decision part 12 of the end of the operation.

For example, upon the operation determination part 11 determining, as the operation that the electronic book reader 50 should execute, the operation of turning a page, the operation instruction part 13 reads and plays the data of the page turned from the book data 22, and instructs the display unit 4 to display the played page. Further, upon the operation determination part 11 determining, as the operation that the electronic book reader 50 should execute, the operation of downloading the electronic book, the operation instruction part 13 instructs the communication unit 2 to download the electronic book via the Internet from a server where the electronic book is stored. Then, the operation instruction part 13 adds the downloaded electronic book to the book data 22 of the storage unit 20, and stores the downloaded electronic book in the storage unit 20.

Power Source Switching Process

Figure 4:
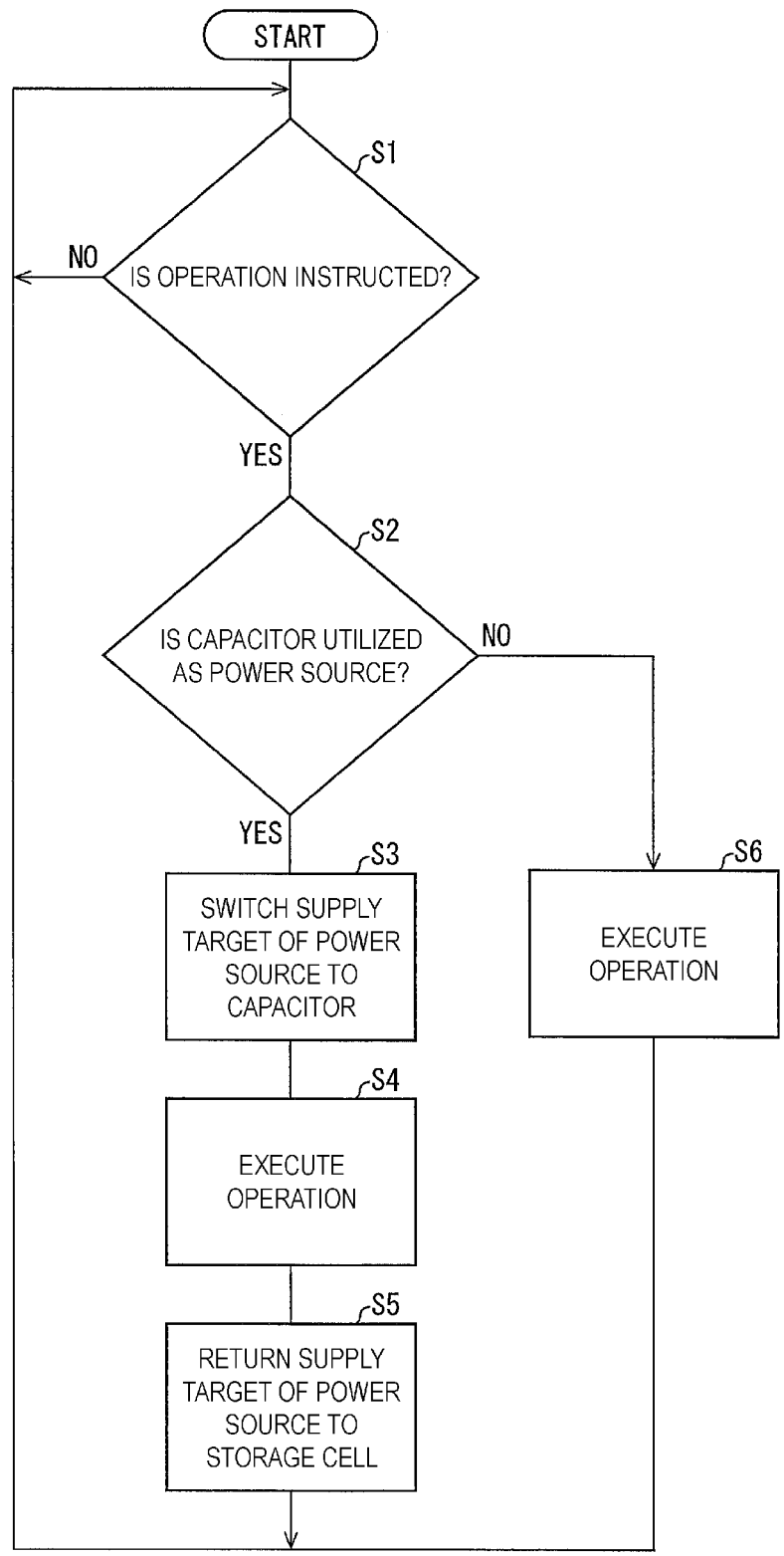
FIG. 4 is a flow chart illustrating a flow of a power source switching process executed in the electronic book reader.

FIG. 4 is a flow chart illustrating a flow of a power source switching process executed in the electronic book reader 50 having the above constitution.

First, the electronic book reader 50 is started in a state where a power source to be used is the storage cell 7. In other words, when the electronic book reader 50 is in the initial state, a connection target of the terminal 41*a* in the power source unit 30 is set on the storage cell 7 side.

Upon completion of the start of the electronic book reader 50, as illustrated in FIG. 4, the operation determination part 11 waits until the operation determination part 11 receives a user instruction of an operation to be executed in the operation unit 1 (S1). Upon the operation being instructed (YES in S1), the operation determination part 11 determines the instructed operation, and the power source decision part 12 refers to the power source table 21 to decide a power source corresponding to the determined operation.

Upon the capacitor 6 being utilized as the power source (YES in S2), the power source decision part 12 instructs the switching part 31 to switch the power source to be used to the capacitor 6 from the storage cell 7 (S3), and the operation instruction part 13 executes the operation determined by the operation determination part 11 (S4). Upon the operation being ended, the power source decision part 12 instructs the switching part 31 to return the power source to be used to the storage cell 7 from the capacitor 6 (S5), and then, returns to step S1 to repeat the above operation.

On the other hand, upon the storage cell 7 being utilized as the power source (NO in S2), the operation instruction part 13 executes, without the power source decision part 12 instructing the switching part 31 to make a switch, the operation determined by the operation determination part 11 (S4). Thereafter, the process returns to step S1 to repeat the above operation without the power source decision part 12 instructing the switching part 31 to make a switch.

Second Embodiment

Figure 5:
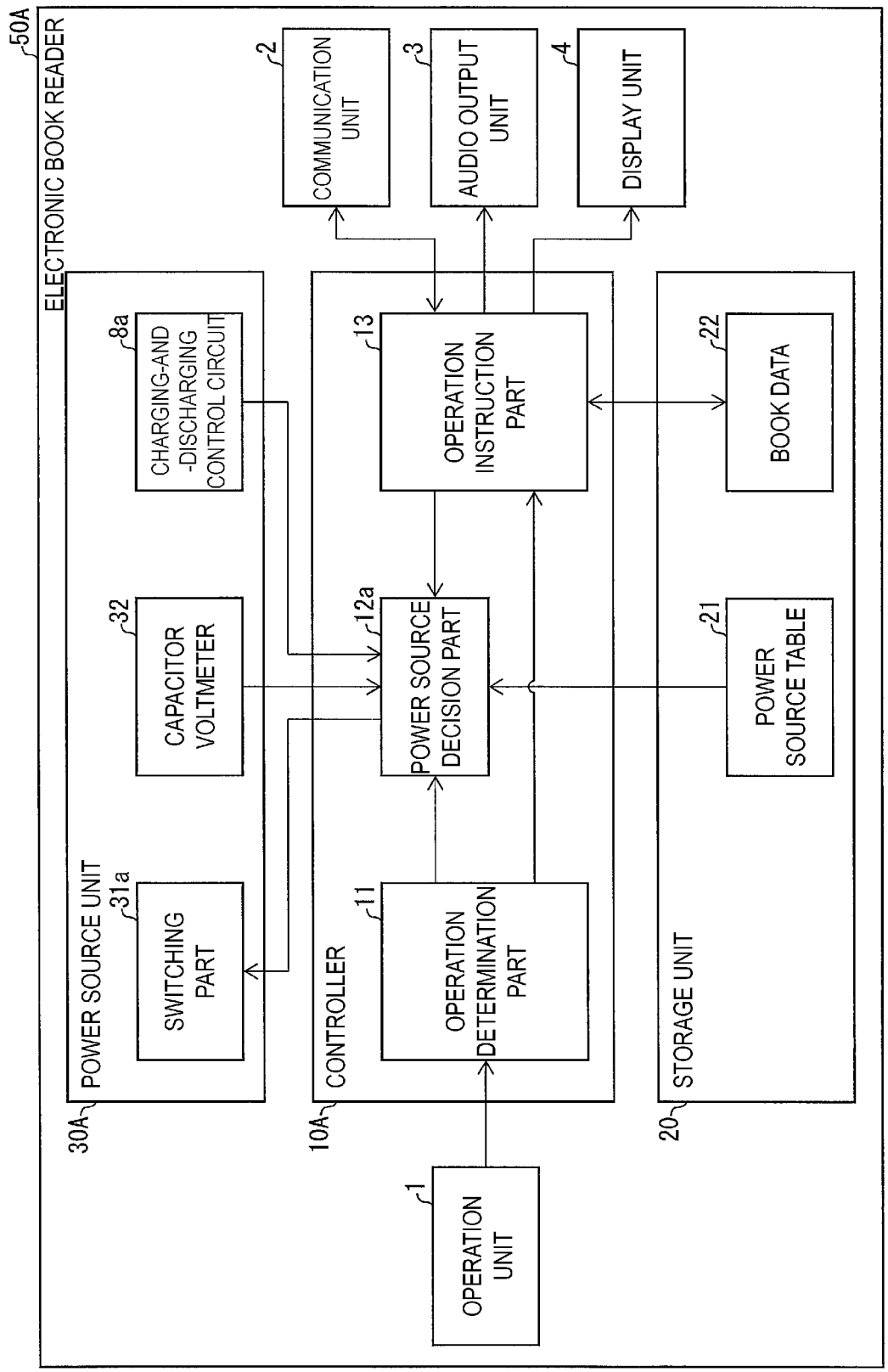
FIG. 5 is a functional block diagram illustrating a schematic constitution of an electronic book reader according to another embodiment of the present invention.

Another embodiment of the present invention will be described with reference to FIGS. 5 to 7. FIG. 5 is a functional block diagram illustrating a schematic constitution of an electronic book reader 50A according to the present embodiment. Unlike the electronic book reader 50 illustrated in FIGS. 1 to 4, the electronic book reader 50A illustrated in FIG. 5 differs in that a controller 10A and a power source unit 30A are provided, instead of the controller 10 and the power source unit 30, and is otherwise constituted in much the same way.

Detail of Power Source Unit

Figure 6:
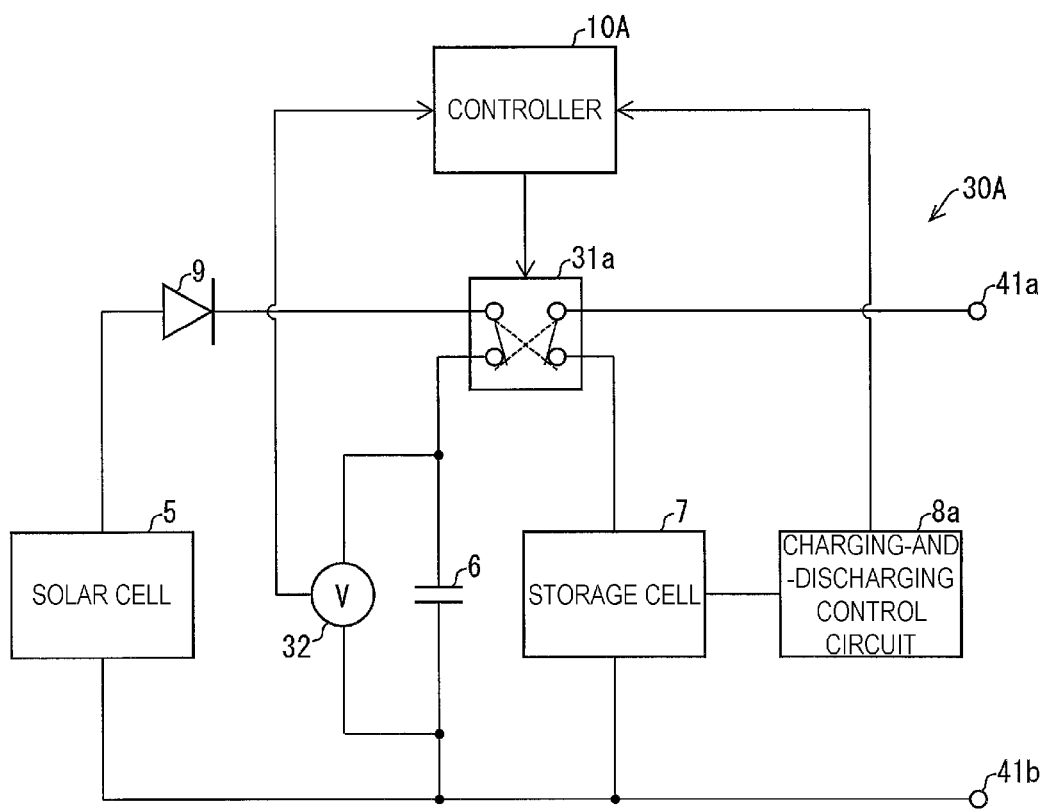
FIG. 6 is a block diagram illustrating a constitution example of a power source unit of the electronic book reader.

FIG. 6 is a block diagram illustrating a constitution example of the power source unit 30A in the electronic book reader 50A. Unlike the power source unit 30 illustrated in FIG. 2, the power source unit 30A illustrated in FIG. 6 differs in that instead of the switching part 31 and the charging-and-discharging control circuit 8, a switching part 31*a* and a charging-and-discharging control circuit 8*a* are each provided and a capacitor voltmeter (voltage detection device) 32 is further provided, and is otherwise constituted in much the same way. That is, unlike the power source unit 30 illustrated in FIG. 2, the power source unit 30A illustrated in FIG. 6 differs in that, the controller 10 switches the switching part 31*a* to accumulate the electric energy from the solar cell 5 in either one of the capacitor 6 or the storage cell 7.

The capacitor voltmeter 32 is a voltmeter connected in parallel to the capacitor 6, and for detecting voltage of the capacitor 6. The capacitor voltmeter 32 transmits a detected voltage value of the capacitor 6 to the controller 10A.

Unlike the charging-and-discharging control circuit 8 illustrated in FIG. 2, the charging-and-discharging control circuit 8*a* differs in that the voltage value of the storage cell 7 is transmitted to the controller 10, and is otherwise constituted in much the same way.

The switching part 31*a* is a part for switching, in much the same way as in the switching part 31, on the basis of an instruction from the controller 10, a connection target of the terminal 41*a* to either one of the storage cell 7 side or the capacitor 6 side. In the present embodiment, upon the connection target of the terminal 41*a* is switched to the storage cell 7 side, the switching part 31*a* switches the connection target of the solar cell 5 to the capacitor 6 side. On the other hand, upon the connection target of the terminal 41*a* is switched to the capacitor 6 side, the switching part 31*a* switches the connection target of the solar cell 5 to the storage cell 7 side.

Thus, upon the power from the solar cell 5 being supplied via the switching part 31*a* to the capacitor 6, the power from the storage cell 7 is supplied via the switching part 31*a* and the terminals 41*a*, 41*b* to the load. On the other hand, upon the power from the solar cell 5 being supplied via the switching part 31*a* to the storage cell 7, the power from the capacitor 6 is supplied via the switching part 31*a* and the terminals 41*a*, 41*b* to the load.

Detail of Controller

Unlike the controller 10 illustrated in FIG. 1, the controller 10A illustrated in FIG. 5 differs in that instead of the power source decision part 12, a power source decision part (power source selector, an accumulated power selector) 12*a* is provided, and is otherwise constituted in much the same way.

The power source decision part 12a is a part in which the following function is added to the function provided in the power source decision part 12 illustrated in FIG. 1. That is, the power source decision part 12a acquires the voltage value of the capacitor 6 from the capacitor voltmeter 32, and acquires the voltage value of the storage cell 7 from the charging-and-discharging control circuit 8.

Further, the power source decision part 12a instructs the switching part 31 to utilize, as a power source, the capacitor 6 while the operation determination part 11 does not determine the operation, upon the acquired voltage value of the capacitor 6 being equal to or greater than the voltage value indicating a charging completion of the capacitor 6, and upon the acquired voltage value of the storage cell 7 being equal to or less than the voltage value indicating a prescribed power amount of the storage cell 7. As a result, the power from the solar cell 5 is accumulated in the storage cell 7.

Therefore, even if the capacitor 6 is in a fully charged state and cannot be charged, the power generated by the solar cell 5 can be supplied to the storage cell 7, and thus, the energy can be effectively accumulated. Further, the power from the solar cell 5 is accumulated in the capacitor 6 before the capacitor 6 reaches the fully charged state, and thus, it is possible to avoid a situation where the amount of power accumulated in the capacitor 6 is insufficient for the amount of power required to perform the first operation. Further, upon the power amount equal to or greater than a prescribed power amount being accumulated in the storage cell 7, the power from the solar cell 5 is not supplied to the storage cell 7. This can restrain a charging frequency of the storage cell 7, and as a result, prevent degrading of the storage cell 7.

Power Source Switching Process

Figure 7:
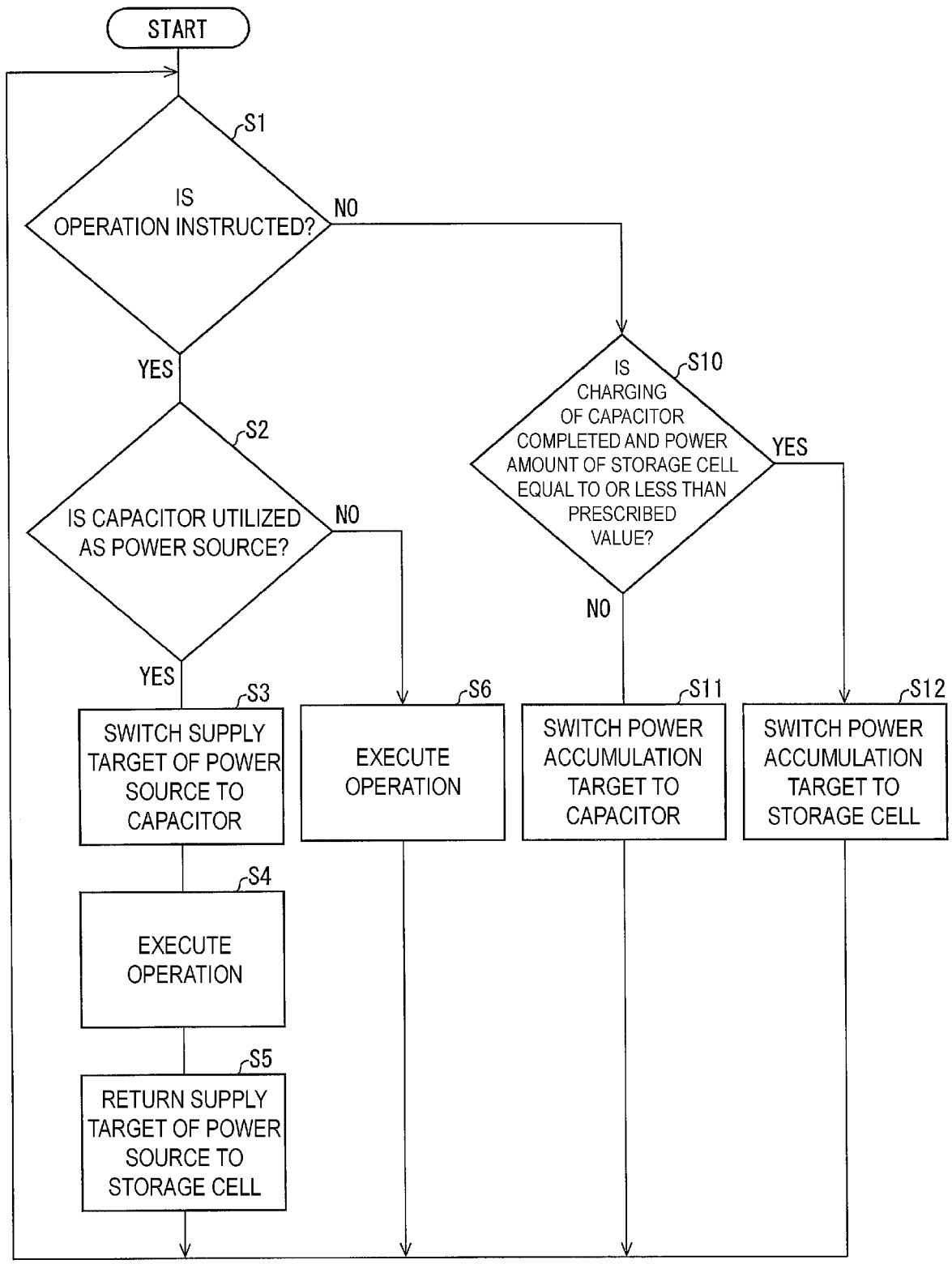
FIG. 7 is a flow chart illustrating a flow of a power source switching process executed in the electronic book reader.

FIG. 7 is a flow chart illustrating a flow of a power source switching process executed in the electronic book reader 50A having the above constitution. Unlike the power source switching process illustrated in FIG. 4, the power source switching process illustrated in FIG. 7 differs in a process in the case where the operation determination part 11 does not determine the operation (NO in S1), and is otherwise constituted in much the same way.

Upon the operation determination part 11 not determining the operation (NO in S1), the power source decision part 12a determines whether or not the voltage value of the capacitor 6 acquired from the capacitor voltmeter 32 is equal to or greater than the voltage value indicating a charging completion of the capacitor 6 and the acquired voltage value of the storage cell 7 is equal to or less than the voltage value indicating a prescribed power amount of the storage cell 7 (S10). That is, the power source decision part 12a determines whether or not a condition that the charging of the capacitor 6 is completed and the power amount of the storage cell 7 is equal to or less than a prescribed value is satisfied (S10).

Upon the condition not being satisfied, the power source decision part 12a switches the power source to be used to the storage cell 7 from the capacitor 6, and switches an accumulation target of the power generated by the solar cell 5 to the capacitor 6 (S11). Thereafter, the process returns to step S1 to repeat the above operation.

On the other hand, upon the condition being satisfied, the power source decision part 12a switches the power source to be used to the capacitor 6 from the storage cell 7, and switches the accumulation target of the power generated by the solar cell 5 to the storage cell 7 (S12). Thereafter, the process returns to step S1 to repeat the above operation.

Additional Notes

Note that the solar cell 5 of the present embodiment is preferably an integrated type solar cell. As a result, this can ensure that the generated voltage of the solar cell 5 reaches a chargeable voltage of the storage cell 7 without using a booster circuit. For example, within an illumination range of from 0.1 to 50 $mW/cm^2$, the generated voltage (optimal operation voltage) of the dye sensitized solar cell is about from 0.3 to 0.7 V, and a chargeable voltage of a lithium ion cell is about from 4.0 to 4.5 V. Therefore, in this case, the number of the dye sensitized solar cells to be integrated may be from 7 to 9.

Third Embodiment

Figure 8:
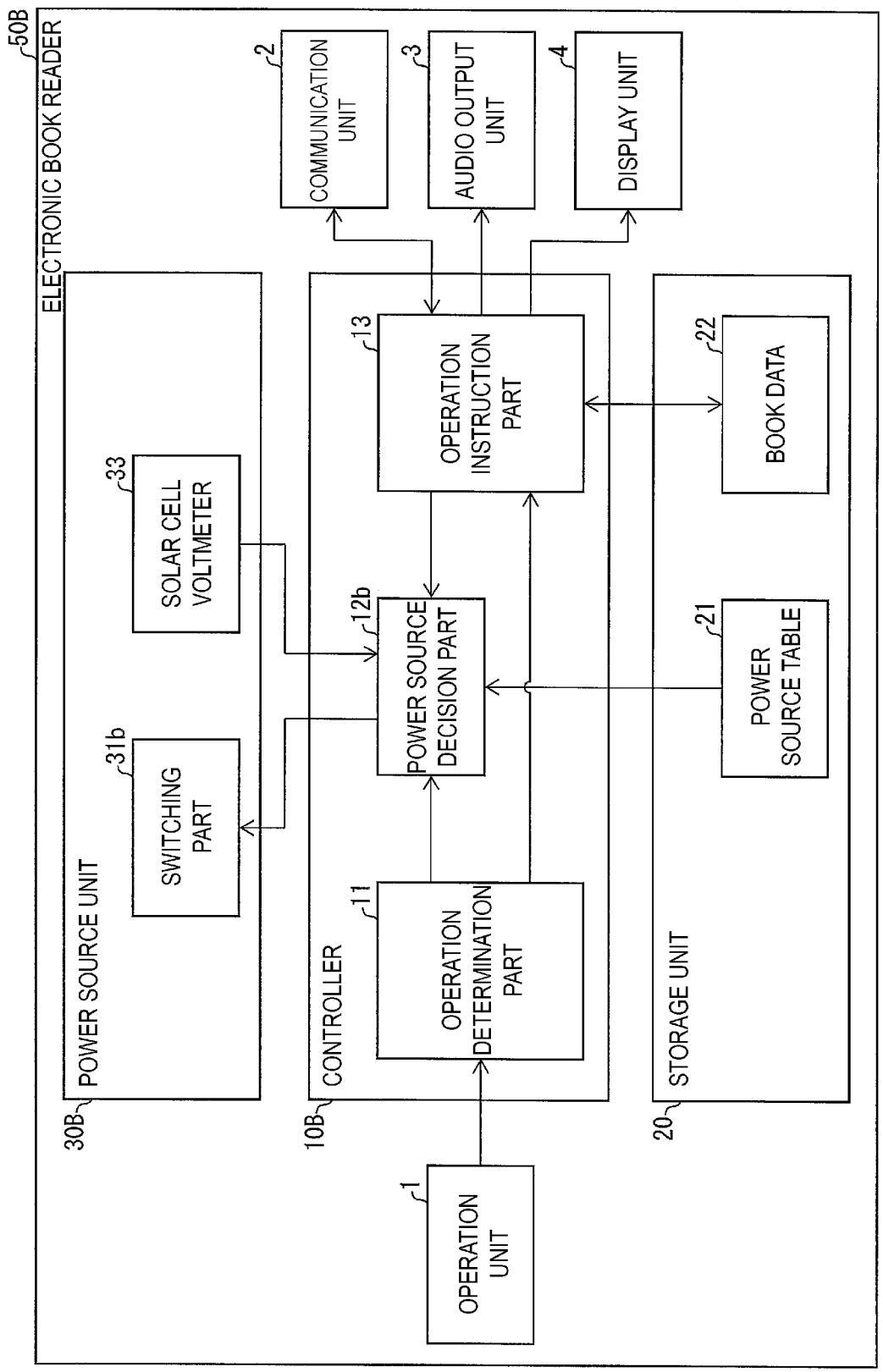
FIG. 8 is a functional block diagram illustrating a schematic constitution of an electronic book reader according to still another embodiment of the present invention.

Still another embodiment of the present invention will be described with reference to FIGS. 8 to 10. FIG. 8 is a functional block diagram illustrating a schematic constitution of an electronic book reader 50B according to the present embodiment. Unlike the electronic book reader 50A illustrated in FIG. 5, the electronic book reader 50B illustrated in FIG. 8 differs in that instead of the controller 10A and the power source unit 30A, a controller 10B and a power source unit 30B are provided, and is otherwise constituted in much the same way.

Detail of Power Source Unit

Figure 9:
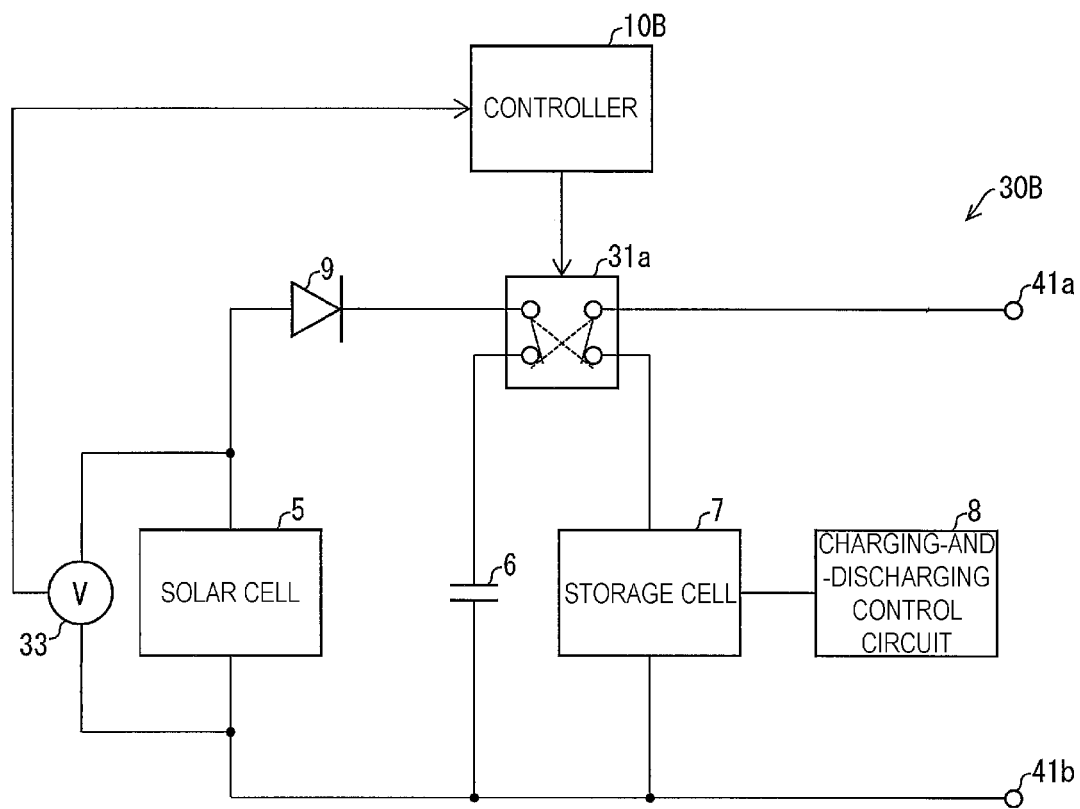
FIG. 9 is a block diagram illustrating a constitution example of a power source unit of the electronic book reader.

FIG. 9 is a block diagram illustrating a constitution example of the power source unit 30B in the electronic book reader 50B. Unlike the power source unit 30A illustrated in FIG. 6, the power source unit 30B illustrated in FIG. 9 differs in that instead of the charging-and-discharging control circuit 8a, the charging-and-discharging control circuit 8 illustrated in FIG. 2 is provided and instead of the capacitor voltmeter 32, a solar cell voltmeter (voltage detection device) 33 is provided, and is otherwise constituted in much the same way.

The solar cell voltmeter 33 is a voltmeter connected in parallel to the solar cell 5, and for detecting generated voltage of the solar cell 5. The solar cell voltmeter 33 transmits the detected generated voltage value of the solar cell 5 to the controller 10B.

Detail of Controller

Unlike the controller 10A illustrated in FIG. 5, the controller 10B illustrated in FIG. 8 differs in that instead of the power source decision part 12a, a power source decision part (power source selector, an accumulated power selector) 12b is provided, and is otherwise constituted in much the same way.

The power source decision part 12b is a part in which the following function is added to the function provided in the power source decision part 12 illustrated in FIG. 1. That is, the power source decision part 12b acquires, upon the operation determination part 11 not determining the operation, the generated voltage value of the solar cell 5 from the solar cell voltmeter 33. Next, the power source decision part 12b instructs, upon the acquired generated voltage of the solar cell 5 being equal to or greater than a prescribed charging start voltage of the storage cell 7, the switching part 31 to utilize the capacitor 6 as a power source. As a result, the power from the solar cell 5 is accumulated in the storage cell 7.

Therefore, upon the generated power of the solar cell 5 being great, the generated power is supplied to the storage cell 7, and thus, can be efficiently charged in the storage cell 7. This restrains a charging frequency of the storage cell 7, and as a result, prevents degrading of the storage cell 7.

Power Source Switching Process

Figure 10:
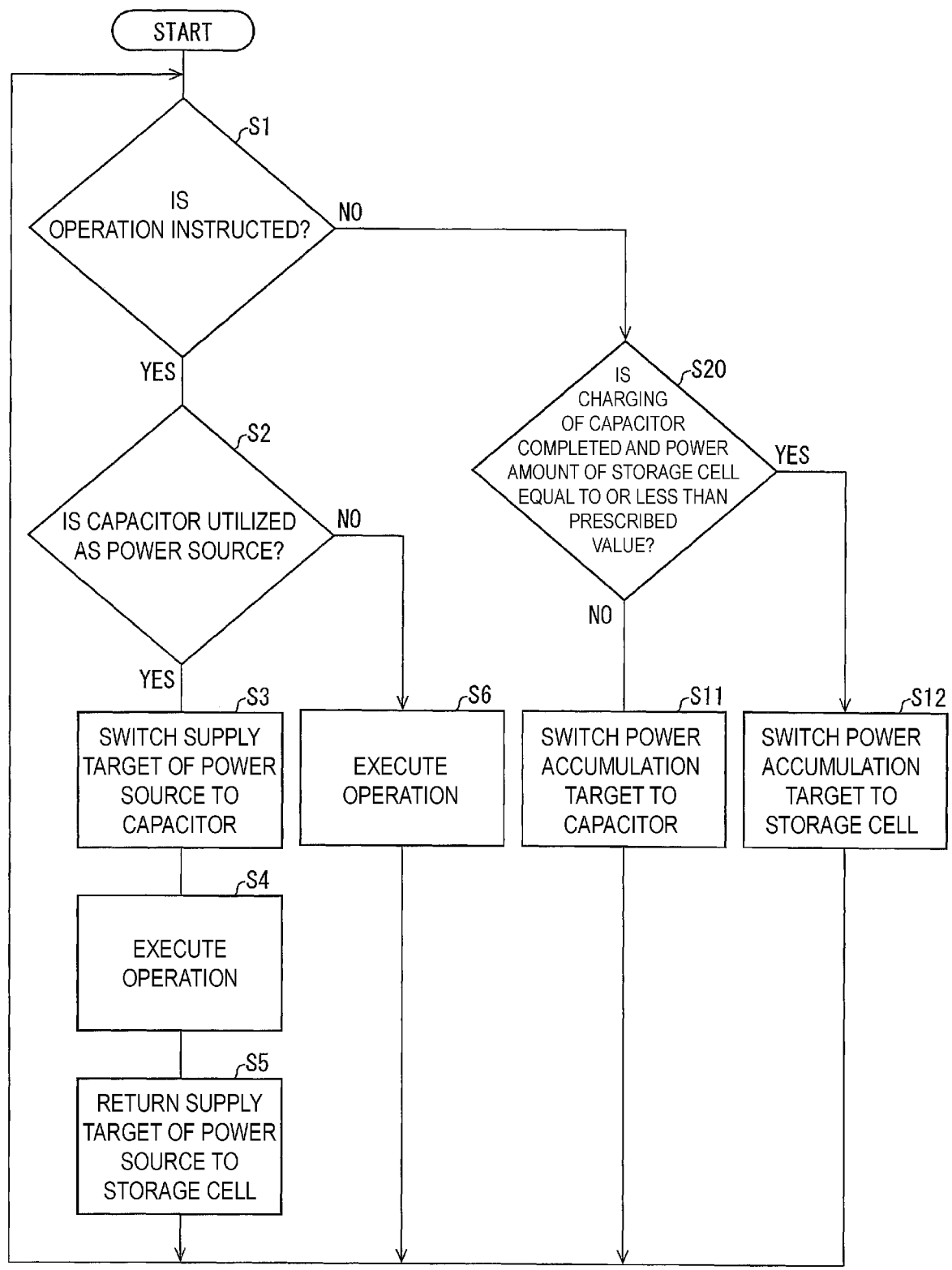
FIG. 10 is a flow chart illustrating a flow of a power source switching process executed in the electronic book reader.

FIG. 10 is a flow chart illustrating a flow of a power source switching process executed in the electronic book reader 50B having the above constitution. Unlike the power source switching process illustrated in FIG. 7, the power source switching process illustrated in FIG. 10 differs in that instead of step S10 in the process in the case where the operation determination part 11 does not determine the operation (NO in S1), step S20 is executed, and is otherwise constituted in much the same way.

In step S20, upon the operation determination part 11 not determining the operation (NO in S1), the power source decision part 12b determines whether or not the generated voltage value of the solar cell 5 acquired by the solar cell voltmeter 33 is equal to or greater than a prescribed charging start voltage of the storage cell 7. Upon the generated voltage value being less than the charging start voltage (NO in S2), the power source decision part 12b switches the power source to be used to the storage cell 7 from the capacitor 6, and switches an accumulation target of the power generated by the solar cell 5 to the capacitor 6 (S11). Thereafter, the process returns to step S1 to repeat the above operation.

On the other hand, upon the generated voltage value being equal to or greater than the charging start voltage (YES in S20), the power source decision part 12b switches the power source to be used to the capacitor 6 from the storage cell 7, and switches an accumulation target of the power generated by the solar cell 5 to the storage cell 7 (S12). Thereafter, the process returns to step S1 to repeat the above operation.

Example 1

In the solar cell 5, the generated voltage is decreased upon the illumination being decreased. Upon a decrease amount of the generated voltage due being large to the decrease of the illumination being large, if the illumination is decreased, a total of the generated voltage may not reach voltage required to operate the circuit or the charging start voltage. Thus, in the embodiments, the solar cell 5 is desirably designed that a decrease amount of the generated voltage for a decrease of the illumination is small.

Therefore, in the electronic book reader 50 illustrated in FIGS. 1 to 4, the dye sensitized solar cell was adopted as the solar cell 5, concentration X of $I_3^-$, which is mainly recombined, was variously changed, and a relationship between the illumination and the generated voltage of the solar cell 5 was studied. As a result, a graph illustrated in FIG. 11 was obtained. In the illustrated graph, the horizontal axis denotes an illumination (mW/cm$^2$), and the vertical axis denotes a generated voltage normalized upon X=0.1 M (100 mol/m$^3$) and the illumination being 100 mW/cm$^2$.

Figure 11:
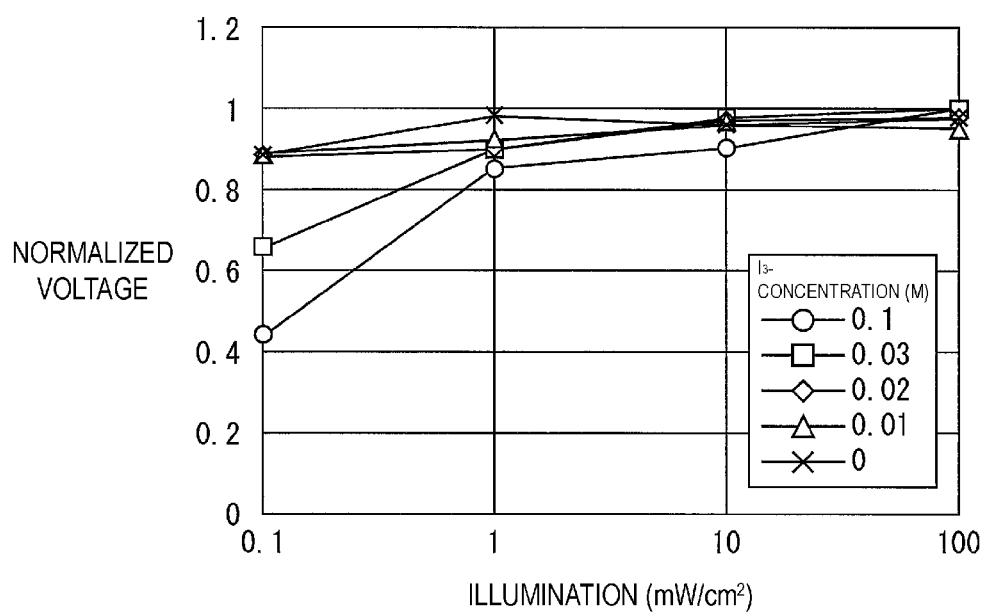
FIG. 11 is a graph illustrating a relationship between illumination and generated voltage in a dye sensitized solar cell, in one embodiment of the present invention.

With reference to the graph illustrated in FIG. 11, it is understood that upon the concentration X of an iodine ion $I_3^-$ being equal to or less than 0.02 M (20 mol/m$^3$), a change of the generated voltage due to the illumination was restrained. This may be explained by the following reasons.

That is, the dye sensitized solar cell contains titanium oxide in which dye is adsorbed and an iodine-based electrolytic solution. When the dye absorbs light, an electron is excited; the electron is immediately injected into a conduction band of the titanium oxide, and carried via an electrode at one side to an external circuit. The dye that passes the electron receives an electron from an iodine ion $I^-$ of the iodine-based electrolytic solution, and returns to a ground state. On the other hand, the iodine ions that passed the electron turn into $I_3^-$, and receive an electron via an electrode at the other end from the external circuit. Thus, a current flows to the external circuit.

At this time, upon there being a large number of iodine ions $I_3^-$ near a surface of the titanium oxide, a transfer (recombination process) of electrons from the inside of the titanium oxide to the iodine ion $I_3^-$ occurs, and as a result, open circuit voltage (generated voltage) of the dye sensitized solar cell is decreased.

On the other hand, upon the concentration X of the iodine ion $I_3^-$ being set to 0.02 M (20 mol/m$^3$) or less, the number of the iodine ions $I_3^-$ near the surface of the titanium oxide is reduced, and this restrains the transfer of electrons from the inside of the titanium oxide to the iodine ion $I_3^-$. As a result, this can maintain the open circuit voltage (generated voltage) of the dye sensitized solar cell.

Note that a lowest limit value of the concentration of the iodine ion $I_3^-$ is not particularly limited; however, it is known that upon addition of a supply source of the iodine ion $I^-$ such as an iodide only to a solvent and the like without addition of a supply source of the iodine ion $I_3^-$ such as iodine $I_2$ to a solvent and the like, the concentration of the iodine ion $I_3^-$ is changed, through absorption photometry, to $1.0 \times 10^{-9}$ M ($1.0 \times 10^{-6}$ mol/m$^3$).

Realization Example by Software

A control block (in particular, the controller 10) of the electronic book reader 50 may be realized by a logic circuit (hardware) formed by an integrated circuit (IC chip) and the like, or by software by using CPU.

In the latter case, the electronic book reader 50 includes CPU in which a command of a program, that is software, to realize each function is executed, ROM or a storage device (these are referred to as "recording medium") in which the program and various types of data are recorded in a manner capable of being read by a computer (or CPU), and RAM to develop the program. Then, when the computer (or CPU) reads the program from the recording medium and executes the program, an object of the present invention is achieved. As the recording medium, a "non-temporarily concrete medium", for example, a tape, a disk, a card, a semiconductor memory, a programmable logic circuit, and the like may be used. Further, the program may be supplied to the computer via any transmission medium (communication network, a broadcast wave, and the like) capable of transmitting the program. Note that the present invention may be realized in a mode of a data signal embodied by electronically transmitting the program, where the data signal is embedded in a carrier wave.

Additional Notes

Note that in the embodiments, the present invention is directed at the electronic book reader; however, the present invention is not limited to the electronic book reader, and the present invention may be applied to any electronic apparatus in which a storage cell and a solar cell are provided as a power source.

Summary

An electronic apparatus (electronic book reader 50) according to a first aspect of the present invention is an electronic apparatus including a solar cell 5 and a storage cell 7. The apparatus includes a capacitor 6 configured to accumulate power generated by the solar cell, and a power source selector (power source decision part 12) configured to select a power source configured to allow the electronic apparatus to operate. The power source selector selects, as the power source, the capacitor upon the electronic apparatus performing a first operation executable with a power amount equal to or less than a prescribed value. On the other hand, the power source selector selects, as the power source, the storage cell upon the electronic apparatus performing a second operation requiring a power amount greater than the prescribed value.

According to the constitution, the power generated by the solar cell is accumulated in the capacitor, and thus, the solar cell can stably supply a good amount of power equal to or less than a prescribed value to a load of the electronic apparatus. Thus, upon the electronic apparatus performing the first operation executable with a power amount equal to or less than a prescribed value, the capacitor is utilized as the power source, and on the other hand, upon the electronic apparatus performing the second operation requiring a power amount greater than a prescribed value, the storage cell can be utilized as the power source. As a result, a frequency of discharging from the storage cell can be reduced. Further, whether or not either one of the capacitor or the storage cell is selected as a power source is decided on the basis of the operation of the electronic apparatus. This eliminates the need for constantly detecting the power from the solar cell. Therefore, with a simple process, a frequency of discharging from the storage cell can be reduced.

An electronic apparatus according to a second aspect of the present invention may be provided that in the first aspect, a rectifying circuit (rectifying device 9) between the solar cell and the capacitor is provided. In this case, the rectifying circuit can prevent a reverse current flow from the capacitor to the solar cell.

An electronic apparatus according to a third aspect of the present invention may be provided that in the first or second aspect, the generated power generated by the solar cell is supplied to the capacitor and also to the storage cell. The electronic apparatus further includes a voltage detection device (capacitor voltmeter 32) configured to detect voltage of the capacitor, and an accumulated power selector (power source decision parts 12a, 12b) configured to select a supply target of the generated power. The accumulated power selector may select, as the supply target of the generated power, the storage cell, upon the voltage of the capacitor detected by the voltage detection device being equal to or greater than voltage indicating that charging of the capacitor is completed. In this case, even if the capacitor is in a fully charged state and cannot be charged, the power generated by the solar cell can be supplied to the storage cell, and thus, the energy can be effectively accumulated.

Upon the generated power generated by the solar cell being supplied to the storage cell where the power is accumulated, the generated power varies depending on a solar irradiance, and thus, charging to the storage cell is discontinuous, hence inefficient.

Therefore, an electronic apparatus according to a fourth aspect of the present invention may be provided that in the first or second aspect, the electronic apparatus is constituted to supply the generated power generated by the solar cell to the capacitor and also to the storage cell. The electronic apparatus further includes a voltage detection device (solar cell voltmeter 33) configured to detect the generated voltage of the solar cell, and an accumulated power selector (power source decision part 12) configured to select a supply target of the generated power. The accumulated power selector may select, as the supply target of the generated power, the storage cell upon the generated voltage being equal to or greater than a prescribed value. In this case, upon the generated power being large, the generated power is supplied to the storage cell, and thus, can be efficiently charged in the storage cell.

An electronic apparatus according to a fifth aspect of the present invention may be provided that in the first to fourth aspects, the solar cell is an integrated-type dye sensitized solar cell. In the dye sensitized solar cell, a dye absorbs visible light, and thus, the dye sensitized solar cell can efficiently collect solar light. Therefore, when the dye sensitized solar cell is utilized, the electronic apparatus can efficiently generate power even in a low-illumination environment such as indoor. Further, when the integrated-type solar cell is utilized, the electronic apparatus can ensure that the generated voltage of the solar cell reaches a chargeable voltage of the storage cell without using a booster circuit.

An electronic apparatus according to a sixth aspects of the present invention may be provided that in the fifth aspects, the dye sensitized solar cell contains a titanium oxide in which dye is absorbed and an iodine-based electrolytic solution, and a concentration of an iodine ion $I_3^-$ that passes an electron to the dye preferably is kept to 20 mol/m$^3$ or less.

In this case, the number of iodine ions $I_3^-$ present near a surface of the titanium oxide that receives the electron from the dye and passes it to an electrode is reduced, and a transfer (recombination process) of electrons from inside the titanium oxide to the iodine ion $I_3^-$ is restrained. As a result, this can maintain the open circuit voltage of the dye sensitized solar cell.

A control method of an electronic apparatus according to a seventh aspect of the present invention is a control method of an electronic apparatus including a solar cell, a capacitor configured to accumulate power generated by the solar cell, and a storage cell. The method includes the steps of determining an operation that the electronic apparatus should execute, and selecting, on the basis of the operation determined in the step of determining the operation, a power source configured to allow the electronic apparatus to operate. In the step of selecting the power source, the capacitor is selected as the power source, upon the electronic apparatus performing a first operation executable with a power amount equal to or less than a prescribed value. On the other hand, the storage cell is selected as the power source, upon the electronic apparatus performing a second operation requiring a power amount greater than the prescribed value. In this case, an effect similar to that in the first mode is exhibited.

The electronic apparatus according to each aspect of the present invention may be realized by a computer. In this case, a control program of an electronic apparatus and a computer-readable recording medium fall within the scope of the present invention. The control program is configured to realize, by a computer, the electronic apparatus by operating the computer as each unit provided in the electronic apparatus. The computer-readable recording medium is configured to store the control program.

The present invention is not limited to each of the above-described embodiments. It is possible to make various modifications within the scope of the claims. An embodiment obtained by appropriately combining technical elements each disclosed in different embodiments falls also within the technical scope of the present invention. Further, when technical elements disclosed in the respective embodiments are combined, it is possible to form a new technical feature.

INDUSTRIAL APPLICABILITY

The present invention selects, as a power source, a capacitor configured to accumulate power from a solar cell, upon an electronic apparatus performing a first operation, and on the other hand, selects, as the power source, the storage cell, upon the electronic apparatus performing a second operation. This reduces, with a simple process, a frequency of discharging from the storage cell. As a result, the present invention can be applied to any electronic apparatus operated by a solar cell and a storage cell.

REFERENCE SIGNS LIST

1 Operation unit
2 Communication unit
3 Audio output unit
4 Display unit
5 Solar cell
6 Capacitor
7 Storage cell
8 Charging-and-discharging control circuit
9 Rectifying device (rectifying circuit)
10 Controller
11 Operation determination part
12 Power source decision part (power source selector)
12a, 12b Power source decision part (power source selector, accumulated power selector)
13 Operation instruction part
20 Storage unit
21 Power source table
22 Book data
30 Power source unit
31 Switching part
32 Capacitor voltmeter (voltage detection device)
33 Solar cell voltmeter (voltage detection device)
41a, 41b Terminal
50 Electronic book reader (electronic apparatus)

The invention claimed is:

1. An electronic apparatus including a solar cell and a storage cell, the electronic apparatus comprising:
a capacitor configured to accumulate power generated by the solar cell; and
a power source selector configured to select a power source configured to allow the electronic apparatus to operate,
the power source selector selecting, as the power source, the capacitor when the electronic apparatus performs a first operation executable with an amount of power consumption equal to or less than a prescribed value; and
the power source selector selecting, as the power source, the storage cell when the electronic apparatus performs a second operation requiring an amount of power consumption greater than the prescribed value.

2. The electronic apparatus according to claim 1, wherein the electronic apparatus is configured to supply generated power generated by the solar cell to the capacitor and also to the storage cell,
the electronic apparatus further comprises:
a voltage detection device configured to detect voltage of the capacitor; and
an accumulated power selector configured to select a supply target of the generated power, and
the accumulated power selector selects, as the supply target of the generated power, the storage cell, when the voltage of the capacitor detected by the voltage detection device is equal to or greater than voltage indicating that charging of the capacitor is completed.

3. The electronic apparatus according to claim 2, wherein the voltage detection device is a voltmeter connected in parallel to the capacitor.

4. The electronic apparatus according to claim 1, wherein the electronic apparatus is configured to supply generated power generated by the solar cell to the capacitor and also to the storage cell,
the electronic apparatus further comprises:
a voltage detection device configured to detect the generated voltage of the solar cell; and
an accumulated power selector configured to select a supply target of the generated power, and
the accumulated power selector selects the storage cell as the supply target of the generated power when the generated voltage is equal to or greater than the prescribed value.

5. The electronic apparatus according to claim 1, wherein the solar cell is an integrated-type dye sensitized solar cell.

6. The electronic apparatus according to claim 1, further comprising;
a memory stores a power source table where operations including the first operation and the second operation and the power sources being used upon the operations being performed are associated with each other.

7. The electronic apparatus according to claim 1, further comprising;
an operator creating an operating data by a user operating an input device and transmitting the operation data to a controller,
the controller comprising receiving the operation data, and transmitting determination result of whether or not the electronic apparatus performs the operation data including the first operation and the second operation on the basis of the operation data to the power source selector.

8. The electronic apparatus according to claim 1, wherein the electronic apparatus is configured to supply generated power generated by the solar cell to the capacitor and also to the storage cell,
the electronic apparatus further comprises:
a voltage detection device configured to detect the generated voltage of the solar cell; and
an accumulated power selector configured to select a supply target of the generated power, and
the accumulated power selector selects the capacitor as the supply target of the generated power when the generated voltage is less than the prescribed value.

9. A control method of an electronic apparatus including a solar cell, a capacitor configured to accumulate power generated by the solar cell, and a storage cell, the control method comprising the steps of:
determining an operation that the electronic apparatus executes; and
selecting, on the basis of the operation determined in the step of determining the operation, a power source configured to allow the electronic apparatus to operate,
in the step of selecting the power source,
the capacitor being selected as the power source, when the electronic apparatus performs a first operation executable with an amount of power consumption equal to or less than a prescribed value, and
the storage cell being selected as the power source, when the electronic apparatus performs a second operation requiring an amount of power consumption greater than the prescribed value.

* * * * *